(12) United States Patent
Sharma et al.

(10) Patent No.: US 7,836,366 B2
(45) Date of Patent: Nov. 16, 2010

(54) DEFECT LOCALIZATION BASED ON DEFECTIVE CELL DIAGNOSIS

(75) Inventors: Manish Sharma, Wilsonville, OR (US);
Wu-Tung Cheng, Lake Oswego, OR (US)

(73) Assignee: Mentor Graphics Corporation

( * ) Notice: Subject to any disclaimer, the term of this patent is extended or adjusted under 35 U.S.C. 154(b) by 485 days.

(21) Appl. No.: 11/876,430

(22) Filed: Oct. 22, 2007

(65) Prior Publication Data

US 2008/0111558 A1 May 15, 2008

Related U.S. Application Data

(60) Provisional application No. 60/857,963, filed on Nov. 10, 2006.

(51) Int. Cl.
*G01R 31/28* (2006.01)
*G01R 31/14* (2006.01)
*G01R 31/02* (2006.01)
*G01R 31/26* (2006.01)
*G06F 11/00* (2006.01)

(52) U.S. Cl. .................... 714/726; 714/25; 714/724; 714/729; 714/737; 714/742; 324/528; 324/531; 324/537; 324/765; 702/117

(58) Field of Classification Search ................ 714/25, 714/724, 726, 729, 737, 742; 324/528, 531, 324/537, 765; 702/117
See application file for complete search history.

(56) References Cited

U.S. PATENT DOCUMENTS

| | | | |
|---|---|---|---|
| 6,708,306 B2 * | 3/2004 | Bartenstein et al. | 714/741 |
| 7,051,253 B2 * | 5/2006 | Rooney et al. | 714/718 |
| 7,441,168 B2 * | 10/2008 | Yoshida et al. | 714/724 |
| 7,594,206 B2 * | 9/2009 | Yoshida et al. | 716/4 |
| 2006/0053357 A1 * | 3/2006 | Rajski et al. | 714/742 |
| 2006/0111873 A1 | 5/2006 | Huang | |
| 2007/0100586 A1 * | 5/2007 | Cheng et al. | 702/185 |
| 2008/0250284 A1 | 10/2008 | Guo et al. | |

OTHER PUBLICATIONS

Desineni et al., Diagnosis of Arbitrary Defects Using Neighborhood Function Extraction, 2005, IEEE, pp. 1-8.*

Desineni et al., A Logic Diagnosis Methodology for Improved Localization and Extraction of Accurate Defect Behavior, Oct. 22-27, 2006, IEEE, paper 12.3, pp. 1-10.*

Mohammad et al., Fault Models and Test Procedures for Flash Memory Disturbances,Aug. 3, 2001, Kluwer Academic Publishers, pp. 495-508.*

Li et al., Diagnosis of Resistive-Open and Stuck-Open Defects in Digital CMOS ICs, Nov. 2005, IEEE, vol. 24, No. 11, pp. 1748-1759.*

(Continued)

*Primary Examiner*—John J Tabone, Jr.
(74) *Attorney, Agent, or Firm*—Klarquist Sparkman, LLP

(57) ABSTRACT

Among the various embodiments described is a method of detecting defects in a cell of an integrated circuit that analyzes exercising conditions applied to an input of the cell during a capture phase of testing with failed test patterns that produce an indication of a fault and that analyzes the exercising conditions that are applied during a capture phase of testing with observable passing patterns that do not provide an indication of a fault. From the analysis, true failing excitation conditions and passing excitation conditions can be determined and used to identify whether a defect is in the cell or on an interconnect wire of the integrated circuit.

42 Claims, 12 Drawing Sheets

OTHER PUBLICATIONS

Abramovici et al., *Digital Systems Testing and Testable Design, IEEE Press*, pp. 226-227, 234-240 (1990).

Amyeen et al., "Improving Precision Using Mixed-Level Fault Diagnosis," in *Proc. ITC*, pp. 1-10 (Oct. 2006).

Bartenstein et al., "Diagnosing Combinational Logic Designs Using the Single Location At-a-Time (SLAT) Paradigm," *Proc. ITC*, pp. 287-296 (2001).

Blanton et al., "Fault Tuples in Diagnosis of Deep-Submicron Circuits," *Proc. ITC*, pp. 233-241 (2002).

Desineni et al., "A Logic Diagnosis Methodology for Improved Localization and Extraction of Accurate Defect Behavior," *Proc. ITC*, pp. 1-10 (Oct. 2006).

Fan et al., "A Gate-Level Method for Transistor-Level Bridging Fault Diagnosis," *IEEE VLSI Test Symp.*, pp. 266-271 (Apr. 30-May 4, 2006).

Fan et al., "A Novel Stuck-at Based Method for Transistor Stuck-Open Fault Diagnosis," *Proc. ITC*, pp. 253-262 (Nov. 8-10, 2005).

Guo et al., "An Algorithmic Technique for Diagnosis of Faulty Scan Chains," *IEEE Trans. Computer-Aided Design of Integrated Circuits and Systems*, vol. 25, No. 9, pp. 1861-1868 (Sep. 2006).

Higami et al., "Diagnosis of Transistor Shorts in Logic Test Environment," *Proc. Asian Test Symp.*, pp. 354-359 (Nov. 2006).

Hirase et al., "Scan chain diagnosis using IDDQ current measurement," *Proc. Design Automation and Test in Europe*, pp. 1302-1307 (2004).

Huang et al., "Compressed Pattern Diagnosis for Scan Chain Failures," *Proc. ITC*, pp. 744-751 (Nov. 8-10, 2005).

Lavo, "Multiplets, Models and the Search for Meaning: Improving Per-Test Fault Diagnosis," *Proc. ITC*, pp. 250-259 (2002).

Leininger et al., "Diagnosis of Scan-Chains by Use of a Configurable Signature Register and Error-Correcting Codes," *IEEE*, 6 pp. (2004).

Pomeranz et al., "Defect Diagnosis Based on Pattern-Dependent Stuck-At Faults," *Proc. VLSI Design*, pp. 475-480 (2004).

Rajski et al., "Embedded Deterministic Test," *IEEE Trans. Computer-Aided Design of Integrated Circuits and Systems*, vol. 23, No. 5, pp. 776-792 (May 2004).

Sharma et al., "Faster Defect Localization in Nanometer Technology based on Defective Cell Diagnosis," *Proc. ITC*, pp. 1-10 (Oct. 21-26, 2007).

Venkataraman et al., "POIROT: A Logic Fault Diagnosis Tool and Its Applications," Proc. *ITC*, pp. 253-262 (2000).

Waicukauski et al., "Failure Diagnosis of Structured VLSI," *IEEE Design and Test of Computers*, pp. 49-60 (Aug. 1989).

Wen et al., "Fault Diagnosis for Static CMOS Circuits," *Proc. Asian Test Symposium*, pp. 282-287 (1997).

Zou et al., "On Methods to Improve Location Based Logic Diagnosis," *Proc. VLSI Design*, pp. 181-187 (Jan. 3-6, 2006).

\* cited by examiner

DEFECT LOCALIZATION BASED ON DEFECTIVE CELL DIAGNOSIS

RELATED APPLICATIONS

The present application claims the benefit of U.S. Provisional Application No. 60/857,963 filed Nov. 10, 2006, which is herein incorporated by reference.

FIELD

The following disclosed technology relates generally to semiconductor testing and to scan-based testing in particular.

BACKGROUND

When a manufactured integrated circuit die fails scan-based structural testing, logic diagnosis is typically used to determine the source of the failure inside the die. This information enables root cause analysis that can lead to fabrication process and/or design changes that result in an overall higher yield. Logic diagnosis tools today can determine the most likely location inside a failing die from which the failures originate. However, this location information (which is typically a pin or a net in the design) does not tell whether the real defect is a defect on the interconnecting wire (also called a back end defect) or a defect inside the library cell (also called a cell internal defect or front end defect) associated with the identified location.

With integrated circuit fabrication technology advancing from 90 nm to 65 nm and beyond, the ability to distinguish between a cell internal defect and an interconnect defect is becoming critical for faster defect localization. The main reason for this is that, for 90 nm and beyond, a significant number of manufacturing defects and systematic yield limiters lie inside library cells. One of the causes of this is the increasing use of custom designed cells to cope with higher process variations. Hence, for failed dies, it is important to know whether the defect lies inside a cell or on an interconnecting wire. This leads to a faster and cheaper physical failure analysis (PFA) process because the failing die can be directly de-layered all the way down to metal layer 1 (where all the intra-cell connections are) without the need to look at metal layer 2 or higher. This speed-up is becoming more significant with shrinking fabrication technologies that use more and more metal layers. Having fewer layers to examine during PFA also reduces the overall cost of the process. Finally, knowing cell internal defects greatly helps in collecting defect statistics that can point to systematic yield limiting issues in library cells. As an example, for a low yielding wafer, if the majority of the defects are in cells then this can point to certain process steps without going through PFA.

Previous work on cell internal diagnosis can be put in two general categories. Conventional diagnosis works on a logic level model of the design, which may not preserve the actual physical implementation of library cells. Hence, the first category of techniques uses an enhanced model of the design to perform a diagnosis. These techniques can be referred to as defect model-based diagnosis techniques. The models preserve enough physical level information to represent a class of defects inside a cell e.g. transistor level bridges, or transistor stuck opens etc. Doing so enables the diagnosis to identify defects inside a cell. Another variant of such a technique uses a pattern fault model, which models specific defect behaviour by pre-specifying conditions under which a defect may be excited. These conditions can be determined by simulating likely defect types. The main drawback of such techniques is the dependence on a specific defect model for diagnosis. This is risky since unknown defect types, not represented in the model, may go undiagnosed.

A second category of techniques, referred to as excitation condition-based diagnosis, does not require any special circuit model. It is based on the realistic assumption that the excitation of a defect inside a cell will be highly correlated to the logic values at the input pins of the cell. On the other hand, the behaviour of an interconnect defect (e.g. a bridge) will depend more on the logic values on the nets neighbouring a defective wire. Based on this assumption, failing patterns (test patterns that fail on the automatic test equipment (ATE) for a failing die) are used to determine input logic value combinations that potentially excite a cell internal defect, also referred to as failing excitation conditions, for selected candidate cells. Similarly, observable passing patterns (test patterns that pass on the ATE for the failing die but are capable of observing a fault effect at the defect site) are used to determine passing excitation conditions (conditions that do not excite or propagate the defect inside the cell) for candidate cells. Based on the assumption above, a defective cell can be isolated from interconnect defects by correlating the passing and failing conditions. Furthermore, the excitation conditions determined in this process can be used along with SPICE or switch level simulations to determine the actual defect inside the cell.

Considering the advantages of the excitation condition-based diagnosis, this technique was tested in a controlled experiment in which cell internal defects were injected and corresponding fail logs were generated by simulation for an industrial design. These fail logs were then diagnosed using the excitation condition-based strategy. Surprisingly, the technique was able to correctly identify the defective cell in only 25% of the cases. Therefore, there is a need for an improved excitation condition-based diagnosis in order to detect faults in library cells or on interconnects.

SUMMARY

In order to overcome the problems discussed above, embodiments of the disclosed technology include active excitation condition extraction techniques that heuristically determine true failing and passing excitation conditions for candidate defective cells from test patterns with multiple exercising conditions. The failing and passing conditions can be used, for example, to determine whether a defect is in a library cell or on an interconnect connected to the library cell.

In one embodiment, sets of one or more exercising conditions applied to a cell during the capture phase of a failing test pattern are determined. Sets of one or more exercising conditions applied to a cell during the capture phase of an observable passing test pattern are also determined. The exercising conditions in the sets are analyzed to determine true failing excitation conditions and passing excitation conditions. In one embodiment, exercising conditions that are associated with more observable passing patterns than failing test patterns are defined as passing excitation patterns.

In one embodiment the excitation conditions are correlated. If a correlation is found, then a defect in an interconnect wiring of the integrated circuit is declared.

BRIEF DESCRIPTION OF THE DRAWINGS

The foregoing and other objects, features, and advantages of the invention will become more apparent from the following detailed description, which proceeds with reference to the accompanying figures, wherein.

DETAILED DESCRIPTION

Figure 1:
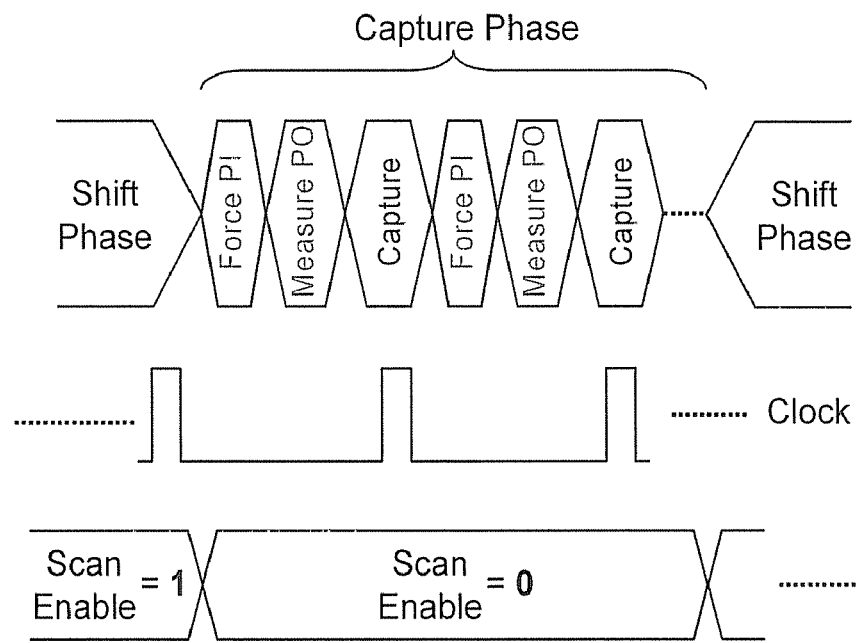
FIG. 1 illustrates a capture phase of a scan test that includes multiple clock cycles.

As will be described in further detail below, the following disclosed technology improves the accuracy of excitation condition-based diagnosis for defect detection. The disclosed embodiments of methods, apparatus, and systems for performing fault diagnosis should not be construed as limiting in any way. Instead, the present disclosure is directed toward all novel and nonobvious features and aspects of the various disclosed methods, apparatus, and systems, alone and in various combinations and subcombinations with one another. The disclosed technology is not limited to any specific aspect or feature, or combination thereof, nor do the disclosed methods, apparatus, and systems require that any one or more specific advantages be present or problems be solved.

Any of the methods, apparatus, and systems described herein can be used in conjunction with a wide variety of scan-based or partially-scan-based circuits. Further, the fault models used in the various embodiments need not be of a particular type, but can vary from implementation to implementation (e.g., stuck-at faults, transition faults, bridging faults, and other such faults).

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine" and "analyze" to describe the disclosed technology. These terms are high-level abstractions of the actual operations that are performed. The actual operations that correspond to these terms may vary depending on the particular implementation and are readily discernible by one of ordinary skill in the art.

The disclosed embodiments can be implemented in a wide variety of environments. For example, any of the disclosed techniques can be implemented in software comprising computer-executable instructions stored on computer-readable media (e.g., one or more CDs, volatile memory components (such as DRAM or SRAM), or nonvolatile memory components (such as hard drives)). Such software can comprise, for example, electronic design automation ("EDA") software (e.g., a fault diagnosis or yield analysis tool) used to perform fault simulation and/or fault diagnostics for a circuit-under-test. These particular software implementations should not be construed as limiting in any way, however, as the principles disclosed herein are generally applicable to other software tools.

Furthermore, the circuit-under-test can be implemented in a variety of different circuits, including application specific integrated circuits ("ASICs"), programmable logic devices ("PLDs") such as field-programmable gate arrays ("FPGAs"), and systems-on-a-chip ("SoCs") having digital, analog, or mixed-signal components thereon. Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits modified or otherwise improved using embodiments of the disclosed technology or equivalents are considered to be within the scope of this disclosure.

Circuit faults that are detected using the disclosed techniques can in some circumstances be repaired. Circuits having faults detected by or repaired after being detected by any of the disclosed embodiments are considered to be within the scope of this disclosure. Furthermore, circuits having designs or manufacturing parameters that were modified as a result of faults being detecting using any of the disclosed embodiments are additionally considered to be within the scope of this disclosure.

Any of the software embodiments described above can be executed in a single computer, a networked computer, or other distributed computing environment (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. For example, the disclosed embodiments can be implemented using a wide variety of commercially available computer languages, computer systems, and/or testing systems. Any of the disclosed methods can alternatively be implemented (partially or completely) in hardware (e.g., an ASIC, PLD, or SoC). Diagnostic results (including final diagnostic results as well as any intermediate result) produced from any of the disclosed methods can be created, updated, or stored on computer-readable media (e.g., one or more CDs, volatile memory components (such as DRAM or SRAM), or nonvolatile memory components (such as hard drives)) using a variety of different data structures or formats. Moreover, any of the disclosed methods can be used in a computer simulation or other EDA environment, where test patterns, test responses, and simulated faults are determined or otherwise analyzed using representations of circuits, which are stored on one or more computer-readable media. For presentation purposes, the present disclosure sometimes refers to a circuit or circuit component by its physical counterpart (for example, scan chain, gate, interconnect, input, output, cell, and other such terms). It should be understood, however, that any reference in the disclosure or the claims to a physical component includes both the physical component and representation of the physical component as used in simulation or other such EDA environments.

FIG. 1 illustrates the typical sequence of events that occurs in a scan-based logic test. Test data is first loaded into the scan chains during the shift phase in which the scan enable signal is activated (here, the scan enable signal is high when activated). Following the shift phase is a repeating sequence of the following operations: force the primary inputs to appropriate values, measure the primary outputs and pulse the capture clock to capture the system logic response to the test pattern in the scan chains. This phase of the testing process is referred to as the capture phase. For the disclosed technology, only failures in the system logic, e.g., failures that are first detected during the capture phase are considered. Failures that occur during the shift phase are typically caused by defects on the scan chain shift path and can be diagnosed using other techniques (e.g., using the technology disclosed in U.S. patent application Ser. No. 11/818,440 filed Jun. 13, 2007, or U.S. Patent Application Publication No. 2006/0111873).

During the capture phase of testing, a defect site may be exercised multiple times with different exercising conditions, i.e. different combinations of logic values applied to the input of a cell. This is due to various reasons, such as the use of multiple capture cycles during testing, the presence of both leading and trailing edge flops in the design, etc. As a result, the mapping from failing test patterns to failing excitation conditions or observable passing test patterns to passing excitation conditions is a non-trivial task. This is because conventional stuck-at fault simulation, which is the basis for most diagnosis techniques, typically does not provide information about which exercising conditions in a single test pattern are true cell internal defect failing excitation conditions. A passive excitation condition extraction strategy, which assumes that all exercising conditions in a failing test pattern are true failing excitation conditions or that all exercising conditions in an observable passing test pattern are passing excitation conditions has been determined not to work well.

An excitation condition-based cell internal defect diagnosis technique is based on the basic premise that if a cell is defective, then the defect inside the cell will be excited and observed on some cell output pins only by certain specific input values to the cell. For other input values to the cell, the defect will remain unexcited or its effect will not propagate to a cell output pin, which means that overall cell function will appear error free. On the other hand, if a defect is on an interconnecting wire between cells then its excitation should be relatively independent of the input values to cell that drives the defective wire. In such cases, the defect excitation will likely be strongly dependent on the values on the wire neighbouring the defective wire.

Figure 2:
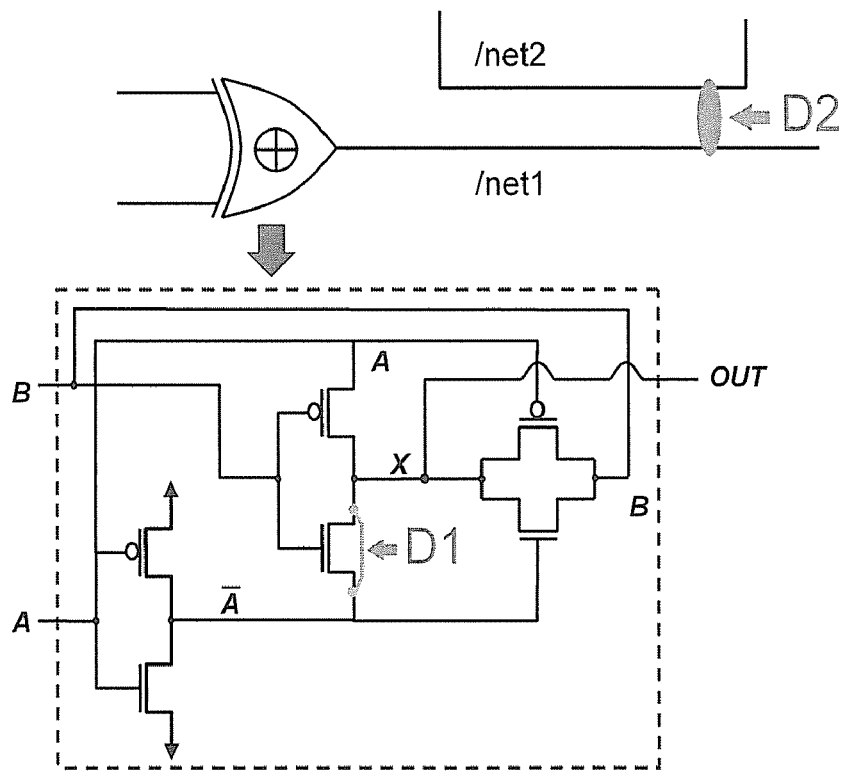
FIG. 2 illustrates a library cell internal defect versus an interconnect defect.

FIG. 2 shows a two input XOR cell driving a net, named /net1. A second net named /net2 neighbours /net1 in the physical layout of the circuit. There are two defects shown in FIG. 2: D1, a bridge defect inside the XOR cell and, D2, a dominant bridge from /net2 to /net1 where /net2 dominates /net1. In order to excite the defect D1, the following two conditions occur. First, input B to the XOR cell is set to a logic 0 so that the NMOS transistor connected to the defect site is OFF. This is because when the NMOS transistor, whose source and drain are bridged, is ON, the behaviour of the defective cell is identical to that of a defect free cell. Second, input A is set to logic 1 so that the pass gate structure that connects B to X is disabled and the inverter structure between A and $\overline{A}$ (of which the defective transistor is a part) is enabled. Under these conditions, a defect free cell will have an output value of logic 1. However, for the defective cell, the output will be logic 0 since it will be pulled down by the short D1 in the NMOS transistor. For the remaining three input value combinations on A and B (00, 11 and 01), the XOR cell functionality will appear error free. Hence, in the presence of D2, only those test patterns that apply a logic 10 value to the two inputs of the XOR gate will potentially fail. On the other hand, the bridge defect, D2, will be excited only when the two nets, /net1 and /net2 assume opposite logic values. In this case, the defect behaviour will be relatively independent of the values at the cell inputs.

In one embodiment of the disclosed technology, the above described distinguishing factor is used to differentiate between a cell internal defect and an interconnect defect. The failing patterns are used to hypothesize what input value exercising conditions excite a potential defective cell and then the hypothesis is tested against observable passing patterns.

As will be appreciated, not all the test patterns applied to a circuit under test are designed to detect a defect in every cell within the circuit. Those test patterns that are designed to detect a defect in a particular cell but do not product an indication of fault on the ATE are called observable passing patterns for the cell.

In one embodiment of the disclosed technology, the identification of a defect being in a cell or on an interconnect wire is performed as follows. The input exercising conditions for a cell in question are determined for those failing test patterns that have produced an indication of fault on the ATE. The input exercising conditions are also determined for the observable passing patterns for the cell. The input exercising conditions for the known failing patterns are correlated against the exercising conditions for the observable passing patterns. If there is a correlation, then it is likely that there is a defect in the cell. If no correlation exists, then it is likely that there is not a defect in the cell and that the defect is on an interconnect wire. In this way, it is possible to not only determine which cell is defective, but also to pin-point the defect inside the cell.

The ability to determine failing and passing excitation conditions from failing and observable passing test patterns is a desirable component of several embodiments of the disclosed technology. However, this is not a trivial task for patterns that exercise defect sites multiple times, which is typically the case for industrial designs. This situation is mainly caused by three reasons. Firstly, most industrial designs are not 100% full scan; they also contain certain non-scan elements. Multiple clock cycles of the capture clock are often needed to test the defects around these non-scan elements. Another reason for having multiple capture cycles is to detect defects, like resistive opens, transistor stuck opens etc., which require a sequence of values to excite them. Multiple capture cycles in a test pattern obviously lead to multiple exercising conditions in the pattern.

Figure 3:
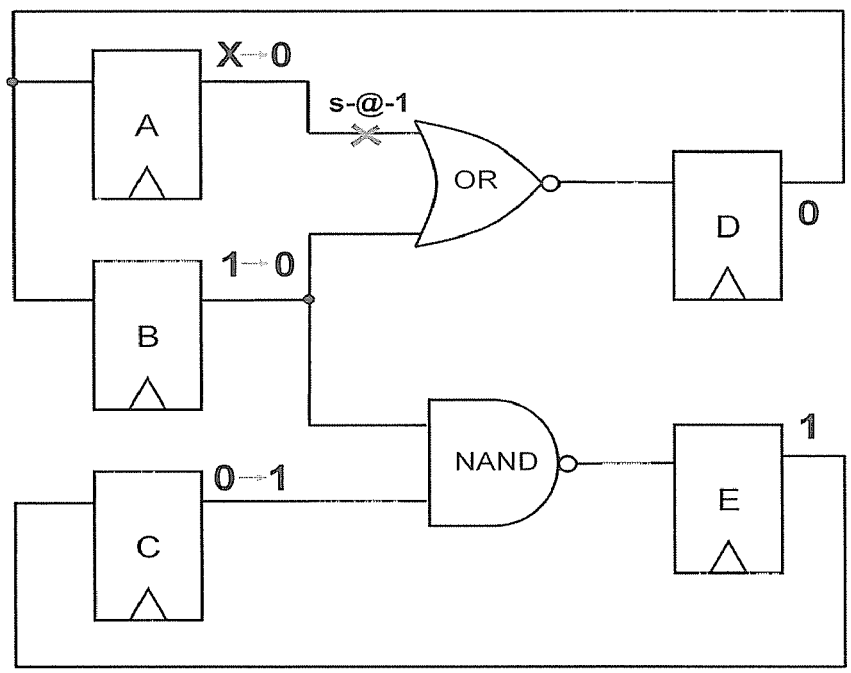
FIG. 3 illustrates a circuit that requires multiple capture clock cycles to detect a fault.

In the hypothetical circuit shown in FIG. 3, flip-flop A (also referred to as flop A) is a non-scan flop, while all the other flops are scan flops. In order to test the stuck-at-1 fault on the output of flop A, a test pattern with two capture clock cycles is used. As shown, the values 1, 0, 0 and 1 are scan loaded into the scan flops B, C, D and E, respectively. The first capture clock cycle applies the excitation value of logic 0 to the fault site (here, the output of flop A) and second capture cycle captures the faulty response in scan flop D, which is then scanned out. As can be seen this two capture clock cycle pattern applies two exercising conditions to the NAND cell (10 and 01) in the capture phase.

Figure 4:
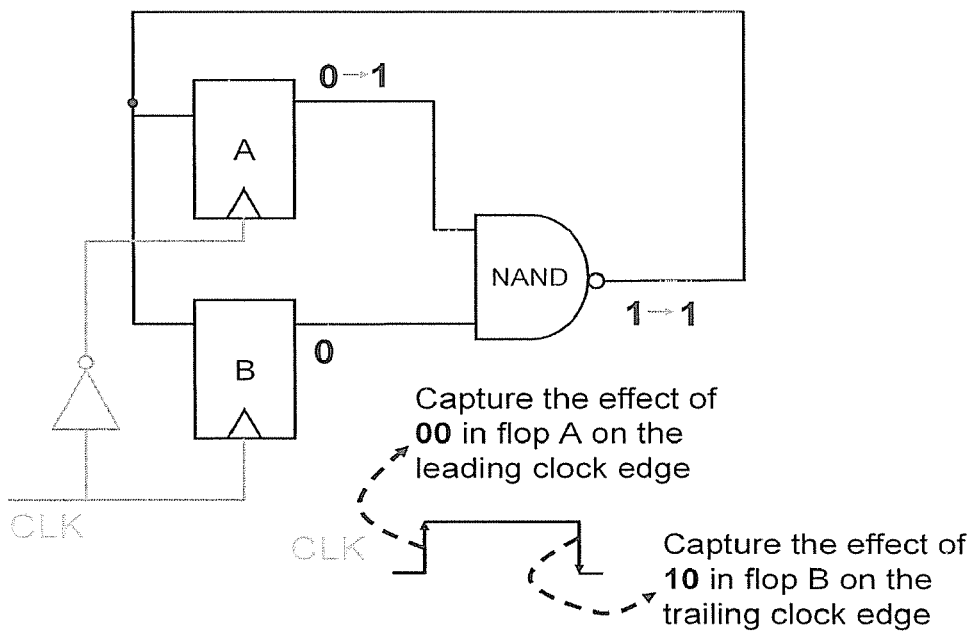
FIG. 4 illustrates a circuit including flops (flip flops) that are triggered on different edges of a clock pulse.

Secondly, the presence of a mix of leading edge and falling edge triggered flops in the design also leads to multiple exercising conditions in a test pattern. In the circuit shown in FIG. 4, flop A is a leading edge triggered flop while flop B is trailing edge triggered. Both the flops are scanned and a test pattern loads logic 0 in both the flops during a shift-in phase. When the capture clock, CLK, is pulsed, the flop A will capture the effect of the exercising condition 00 for the NAND cell on the leading edge. On the trailing the edge of the clock pulse, the flop B will capture the effect of the exercising condition 10. Hence the pair of flops has multiple exercising conditions during a single capture phase. Finally, in some cases, the clock signal feeds into the system logic under test. In such cases, the effect of logic values in the design when the clocks are OFF can be captured in leading edge scan flops or observed at primary outputs, hence resulting in yet another set of exercising conditions.

Figure 5:
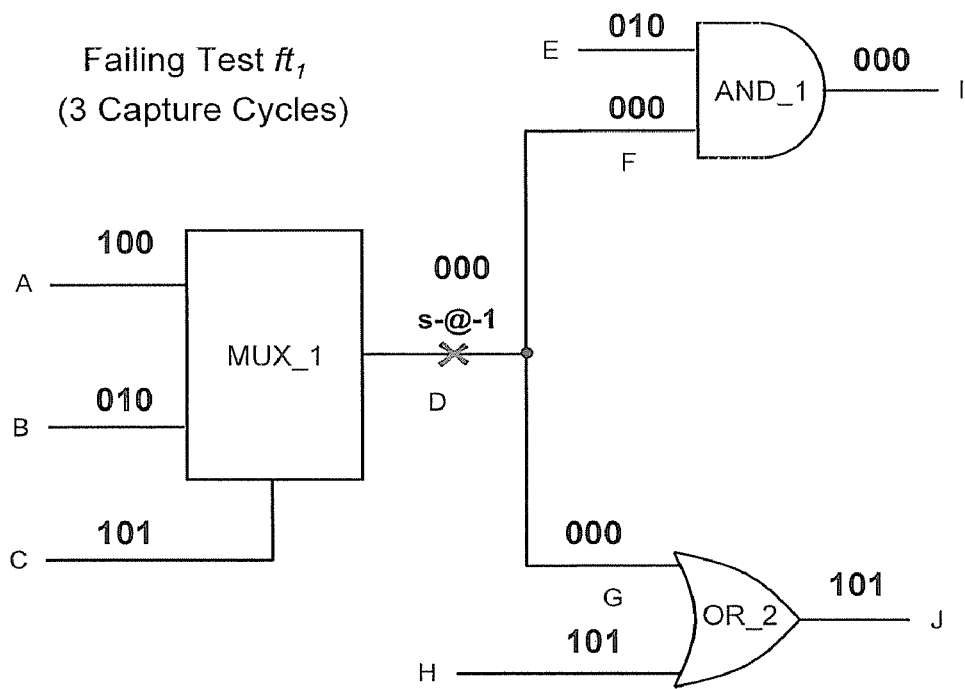
FIG. 5 illustrates a circuit where certain exercising conditions are masked by the effect of other gates in a circuit.

FIG. 5 illustrates a problem caused by multiple exercising conditions during testing. In the example shown, it is assumed that the test patterns applied have three capture clock cycles each. Furthermore, it is assumed that for some failing chip there is a single failing test ($ft_1$), whose logic simulation values are as shown in FIG. 5, and that the failing behaviour is explained by the defect location: D stuck-at-1. In this case, the cell MUX_1 is a defective cell candidate and the failing test $ft_1$ is used to determine the failing excitation conditions for MUX_1. Because there are three exercising conditions (corresponding to the three capture clock cycles) to choose from: 101, 010 and 001, any one or more of these can be the real cell failing excitation condition(s). Since conventional stuck-at-fault simulation does not keep track of the origination and propagation of events by capture cycle, the only information obtained from the stuck-at-fault simulation is whether a fault is detected by a pattern or not. In particular, fault simulation does not tell which cycle was the origination point for a stuck-at-fault activation event that was eventually detected at an observation point (primary output or scan flop).

In the example shown in FIG. 5, it can be seen that the fault D stuck-at-1 will be excited in all the three cycles. However in the first and the last cycles, the fault effect is blocked from propagation at the AND_1 and OR_2 gates. This means that from this failing test, it is only possible to reliably conclude that 010 is a defect excitation condition. The exercising conditions 101 and 001 may or may not be defect excitation conditions, since the fault effect originating at the corresponding cycles was not observed.

Ideally, it would be desirable to enhance fault simulation so that it can provide information as to the fault effect in which cycles actually make it to an observation point. However, doing so would be an impractical solution. Firstly, this would require back-tracing from observation points after faulty machine simulation for all failing and observable test patterns for all defective cell candidates, making it an expensive operation. Secondly, for some test patterns it may still be an incomplete solution. The reason is that, in some cases, the fault effect from one capture clock cycle may get mixed together with fault effects from other cycles due to re-convergence. In such cases, it will become impossible to determine the fault effect from which cycle is observed at the end of the capture phase.

Figure 6:
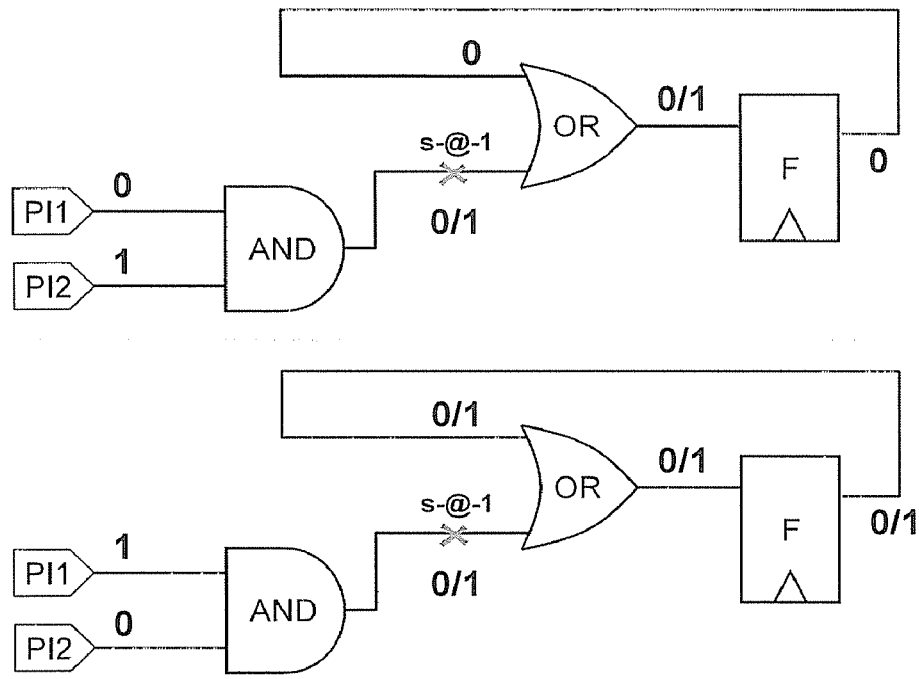
FIG. 6 illustrates a circuit where some input conditions cannot be characterized as passing or failing.

FIG. 6 illustrates an example circuit in which flop F is a scan flop. A test pattern has two capture cycles and the circuit has a stuck-at-1 fault at the output of the AND gate. The values shown in FIG. 6 are the simulation values for the test pattern just before each capture clock pulse. As can be seen, the fault effect from the two different capture clock cycles gets mixed together in the second cycle at the OR gate. Therefore, in this case, if the AND cell is a candidate defective cell, it will be impossible to tell from conventional fault simulation which of the two exercising conditions: 01 or 10 are true failing conditions. Hence, this failing pattern may not be usable.

To address these shortfalls, one exemplary embodiment of the disclosed technology uses a technique based on heuristics, and is referred to herein as active excitation condition extraction. This embodiment determines with high accuracy which exercising conditions in a pattern having multiple exercising conditions are actual failing excitation conditions. This exemplary embodiment also does not require any change to the fault simulation engine and can handle sequence dependent defects. Furthermore, the technique works when using compressed patterns.

The active excitation condition extraction technique extracts one or more (e.g., all) exercising conditions for potential defective cells in a test pattern. This information is recorded for one or more (e.g., all) of the failing and observable passing patterns for each candidate cell. This information is used to determine which exercising conditions are actual failing excitation conditions for the cell internal defect, and which are not.

In the example described below, the set of exercising conditions that are extracted from a test pattern for a candidate defective cell are referred to as the Exercising Conditions Collection (ECC) for that test pattern.

$ECC_1^f, ECC_2^f, \ldots, ECC_k^f$ denote the distinct ECCs for all the failing patterns for a candidate cell. Note that k is less than or equal to the number of failing test patterns, and typically is much less than that number.

Figure 7:
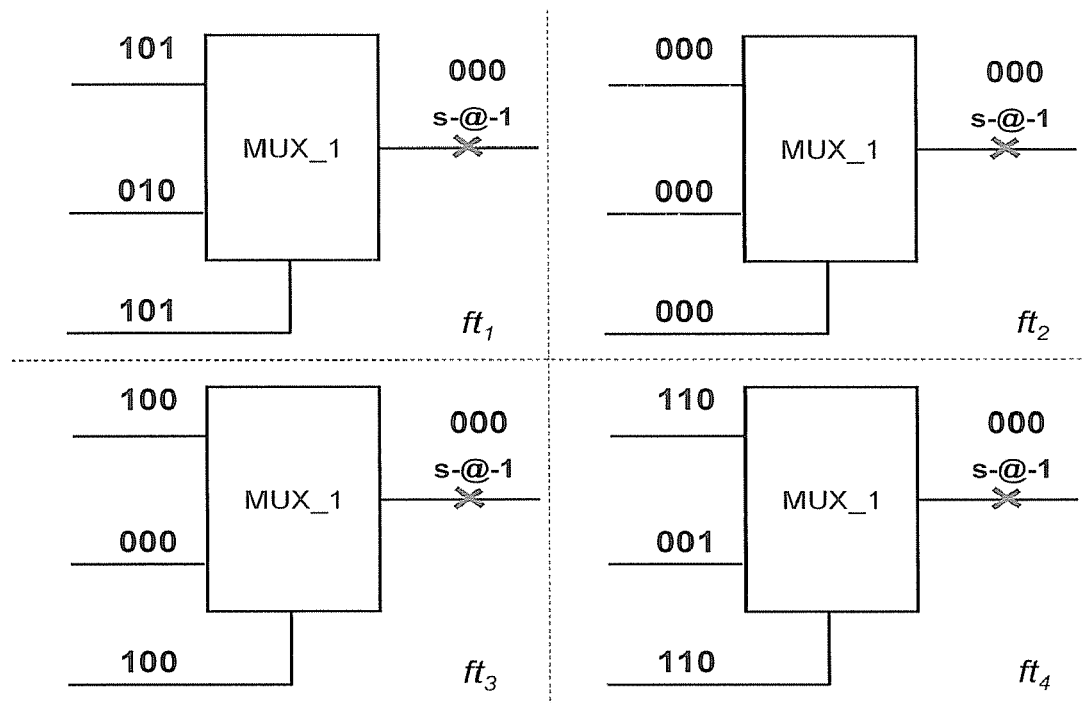
FIG. 7 illustrates exercising conditions for failing test patterns.
Figure 8:
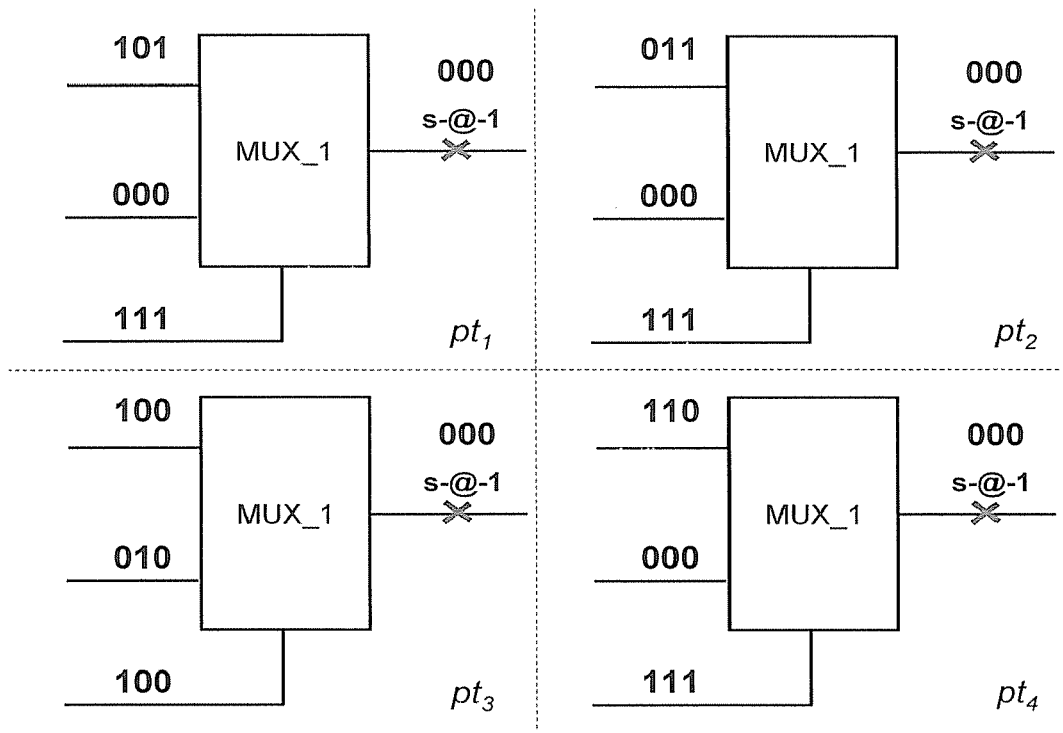
FIG. 8 illustrates exercising conditions for passing test patterns.
Figure 10A:
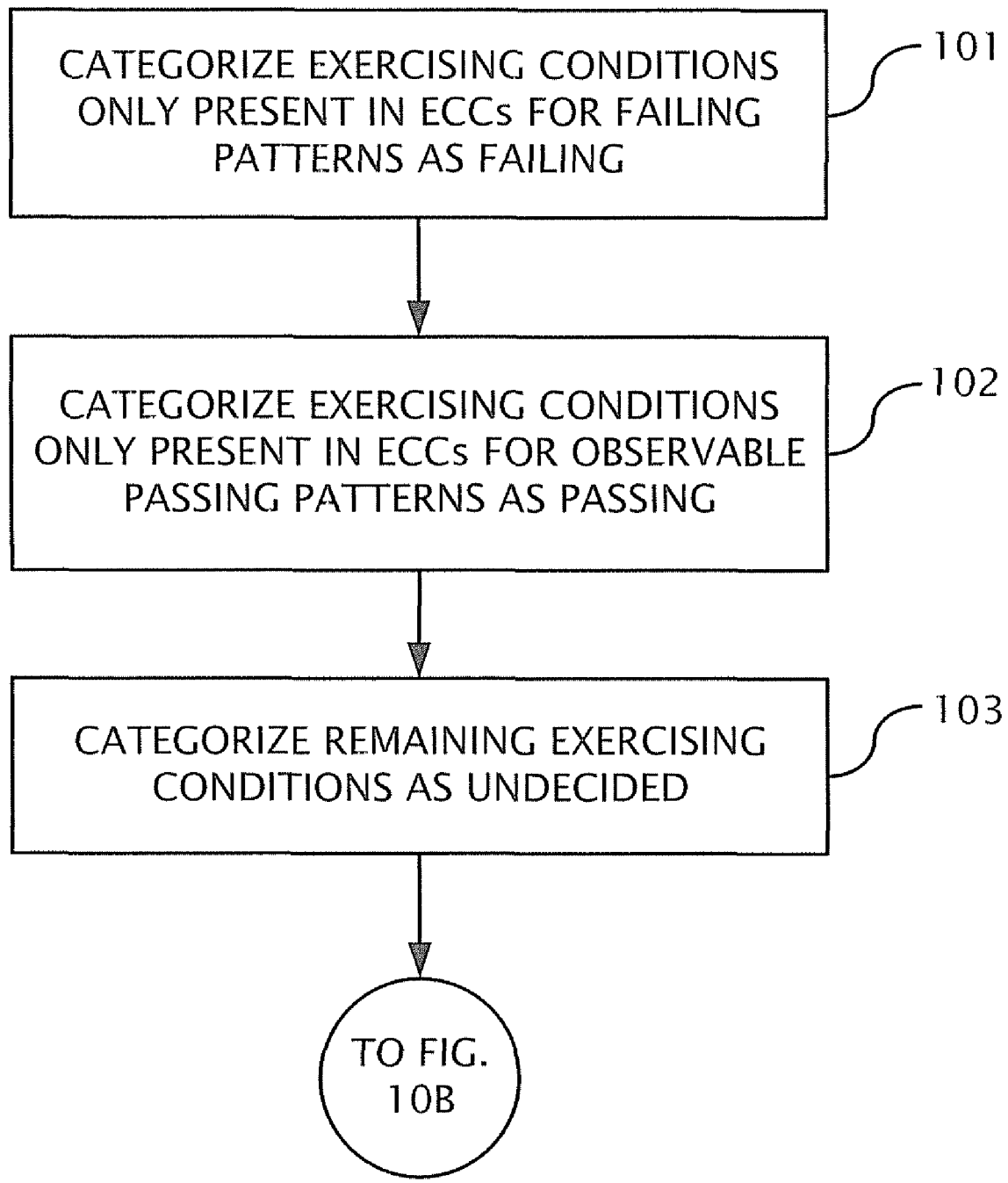
FIGS. 10A-10B illustrate a flow chart of acts performed in accordance with one embodiment of the disclosed technology.
Figure 10B:
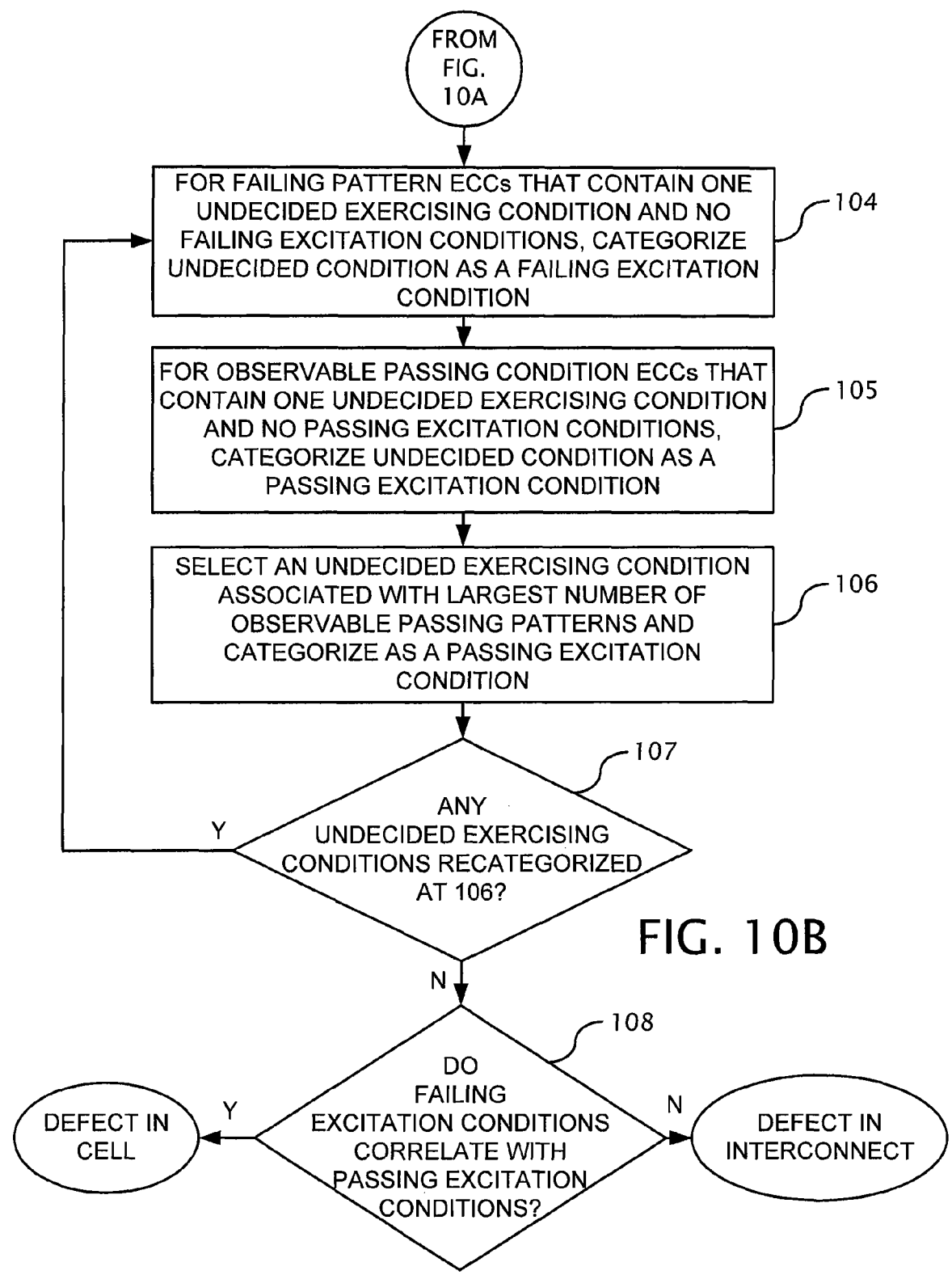

FIG. 7 illustrates an example in which a two input multiplexer cell, MUX_1, is a candidate defective cell. There are four failing test patterns with simulation values as shown. In this case, because the exercising conditions for $ft_1$ and $ft_4$ are the same, there will be three failing pattern ECCs:

$ECC_1^f = \{101,010\} \rightarrow ft_1, ft_4$ $ECC_2^f = \{000\} \rightarrow ft_2$ $ECC_3^f = \{101,000\} \rightarrow ft_3$ In a similar fashion, $ECC_1^p, ECC_2^p, \ldots, ECC_k^p$ denote the distinct ECCs for all the observable passing patterns for a candidate cell. For the observable passing pattern ECCs, the number of observable passing patterns associated is also stored. In the example shown in FIG. 7, there are four observable passing patterns that may detect the stuck-at-1 fault at the MUX_1 output. The simulation values for these are shown in FIG. 8. In this case, the observable passing pattern ECCs will be:

$ECC_1^p = \{101,001\} \rightarrow pt_1, pt_4$ $ECC_2^p = \{000,101,010\} \rightarrow pt_3$ $ECC_3^p = \{101,010\} \rightarrow pt_2^{20}$ FIGS. 10A-10B illustrate one way in which the ECCs and exercising conditions are used to determine the actual failing excitation conditions. Although the acts are described in a particular order, it will be appreciated that the acts could be performed in a different order and still achieve the functionality described.

At 101-103, all the exercising conditions are divided into categories. In this embodiment, at 101, exercising conditions that occur only in failing pattern ECCs are categorized as failing excitation conditions. At 102, exercising conditions that occur only in observable passing pattern ECCs are categorized as passing excitation conditions. At 103, the remaining exercising conditions are categorized as undecided. The undecided exercising conditions will be placed in the other two categories in subsequent steps.

At 104, for the failing pattern ECCs, those ECCs that contain exactly one undecided exercising condition, say i, and no failing excitation condition are determined. This means that the exercising condition, i, must activate the cell internal defect in some failing test pattern; hence its category is changed to a failing excitation condition.

At 105, for the observable passing pattern ECCs, those ECCs that contain exactly one undecided exercising condition, say i, and no passing excitation condition are determined. This means that the exercising condition, i, must not activate the cell internal defect; hence its category is changed to a passing excitation condition At 106, if there are still some undecided exercising conditions left, one which is associated with the largest number of observable passing patterns is selected and its category changed to passing excitation condition. The reasoning behind this is that if an exercising condition occurs in a large number of observable passing patterns then it is likely that it does not excite the cell internal defect. In other embodiments, a different heuristic could be used to determine if an exercising condition should be categorized as a passing or failing condition.

At 107, a determination is made as to whether any undecided exercising condition was converted to a passing excitation condition at 106. If so, the illustrated technique returns to 104.

If the answer at 107 is no, then the categorized exercising conditions for the failing and observable passing patterns are correlated against each other. In one embodiment, the correlation looks to see how many of the failing excitation conditions in the failing pattern ECCs are present in the observable passing pattern ECCs. This number is compared with some predetermined threshold that may vary with a desired confidence factor. For example, if 75% of the failing excitation conditions that are present in the failing pattern ECCs are not present in the observable passing pattern ECCs then it is likely that there is a defect in the selected cell. However, if only 25% of the failing excitation conditions in the failing pattern ECCs are not present in the passing pattern ECCs, then it is likely that the defect is in the interconnect wiring. As will be appreciated, the predetermined threshold number may vary. For example, a 90% correlation may be required before determining that a defect is in a selected cell.

In another embodiment, the correlation may be done by analyzing the categorized exercising conditions for logical inconsistencies. For example there may be no exercising condition that is categorised as a failing excitation condition in each failing pattern ECC or no exercising conditions that is categorized as a passing excitation condition in each of the observable passing pattern ECC or a failing pattern ECC and an observable passing pattern ECC include identical exercising conditions. Any one or more of these logical conflicts can be used to determine that there is no correlation between the exercising conditions and the detected fault. Therefore, the exemplary technique concludes that the defect must be on an interconnect wire of the circuit and not in the library cell.

In the example shown in FIG. 8, the exemplary embodiment of FIGS. 10A-10B will produce the following results:

At 103, the exercising conditions 101, 010 and 000 are placed in the undecided category. Exercising condition 001 is placed in the passing excitation category since it does not occur in any failing test ECC. At 104, the exercising condition 000 will be categorized as a failing excitation condition since it occurs by itself in $ECC_2^f$. At this point there are two undecided conditions: 101 and 010. Because the exercising condition 101 occurs in more observable passing patterns than 010, it is more likely to be a passing excitation condition. Hence, at 106, this exercising condition's category is changed to a passing excitation condition. In the next iteration through acts 104-107, the last remaining undecided condition 010 will be changed to a failing excitation condition at 104 because this condition is now the only undecided condition in $ECC_1^f$.

In the example shown, the exemplary embodiment will conclude that 000 and 010 are failing excitation conditions and that 101 is a passing excitation condition. This means that there will be no conflict between passing and failing excitation conditions for this candidate defective cell and it is likely that the defect is in the multiplexer. If a conflict is found in the passing and failing conditions, then the exemplary embodiment indicates that there is likely a fault in the interconnect wiring and not in the candidate library cell.

Figure 11:
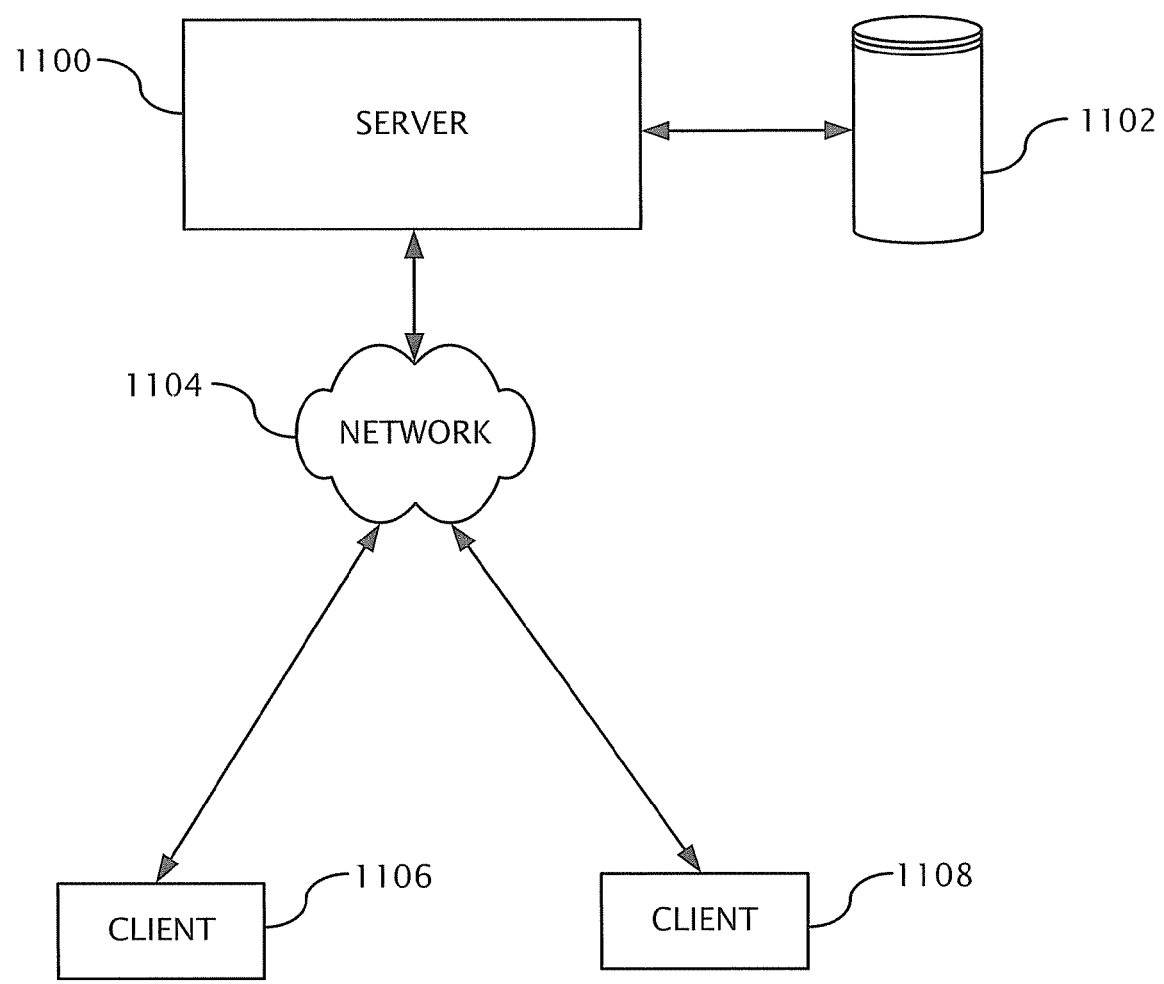
FIGS. 11-12 are representations of computer systems with which the disclosed technology can be implemented.

Any of the aspects of the technology described above may be performed using a stand alone or distributed computer network. FIG. 11 shows one suitable exemplary network. A server computer 1100 can have an associated storage device 1102 (internal or external to the server computer). For example, the server computer 1100 can be configured to perform fault diagnosis using any of the disclosed methods (for example, as part of an EDA software tool, such as a fault diagnosis or ATPG tool). The server computer 1100 can be coupled to a network, shown generally at 1104, which can comprise, for example, a wide-area network, a local-area network, a client-server network, the Internet, or other suitable network. One or more client computers, such as those shown at 1106, 1108, may be coupled to the network 1104 using a network protocol. The work may also be performed on a single, dedicated workstation, which has its own memory and one or more CPUs.

Figure 12:
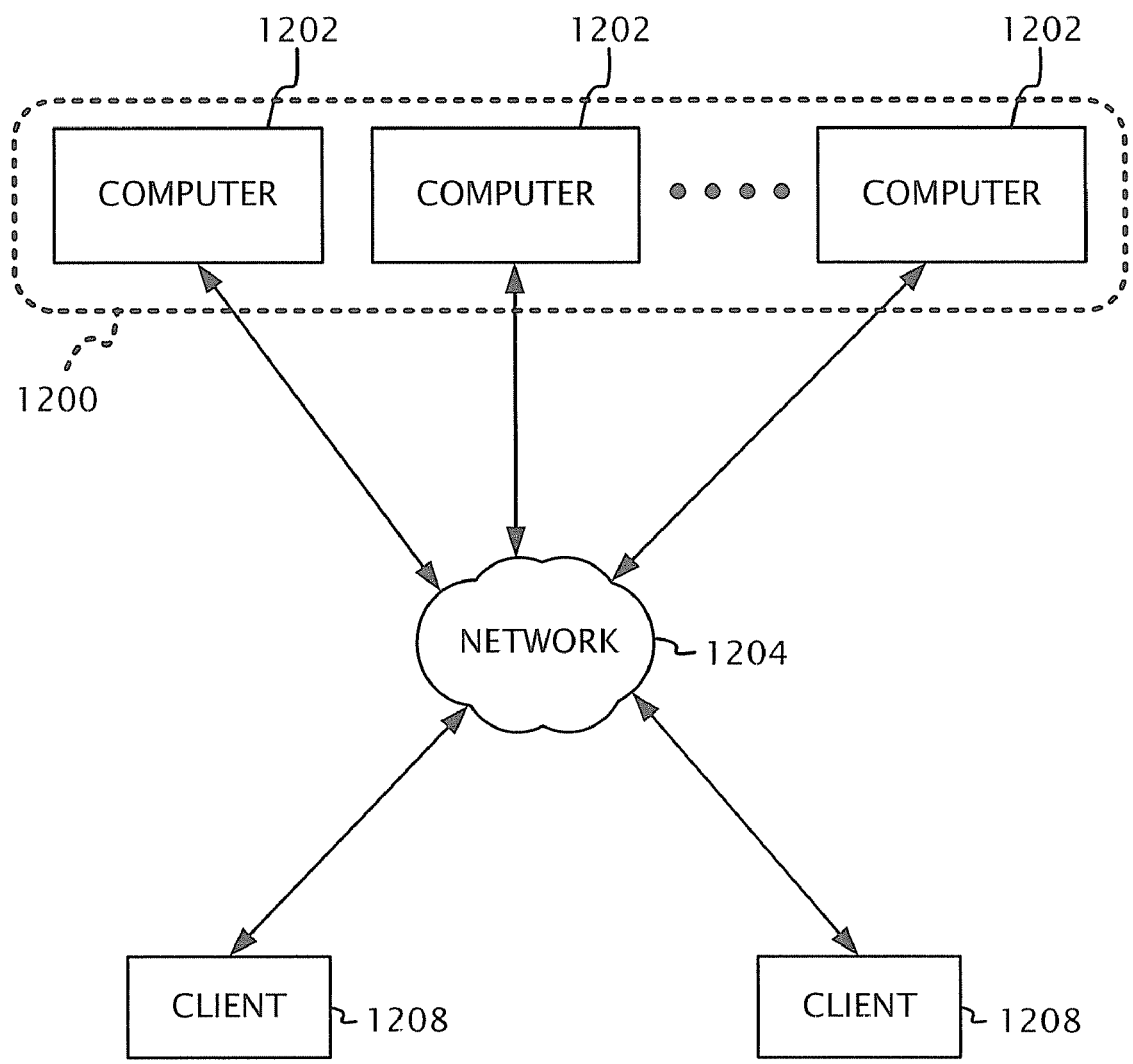

FIG. 12 shows another exemplary network. One or more computers 1202 communicate via a network 1204 and form a computing environment 1200 (for example, a distributed computing environment). Each of the computers 1202 in the computing environment 1200 can be used to perform at least a portion of the active excitation condition analysis as described above. The network 1204 in the illustrated embodiment is also coupled to one or more client computers 1208.

Figure 13:
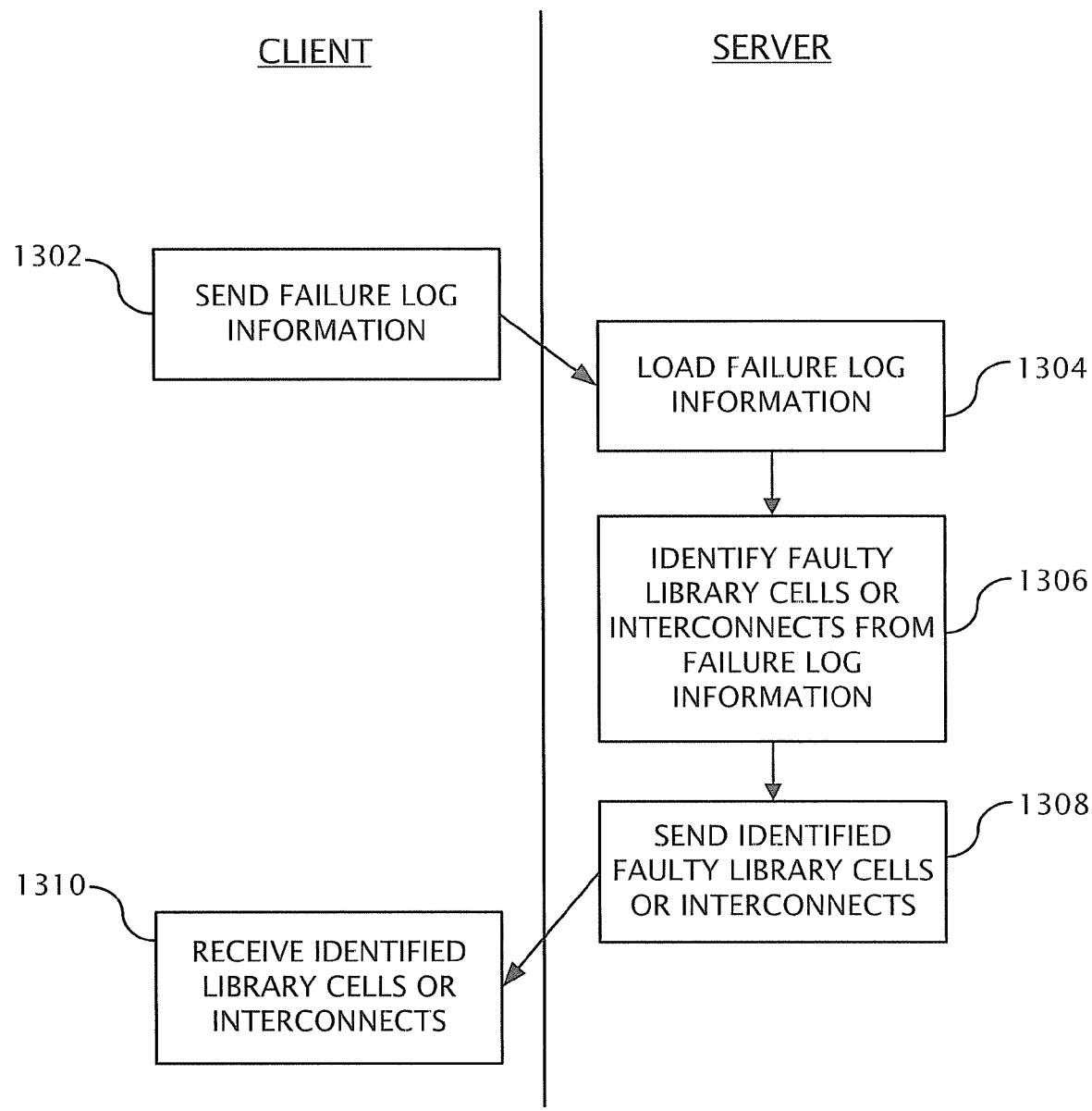
FIG. 13 illustrates an information flow used to detect a defect in a cell in accordance with one embodiment of the disclosed technology.

FIG. 13 shows one exemplary manner in which the networks of FIGS. 11 and 12 can operate to diagnose one or more defects in an electronic circuit. In particular, FIG. 13 shows that one or more entries of an ATE failure log can be analyzed using a remote server computer (such as the server computer 1100 shown in FIG. 11) or a remote computing environment (such as the computing environment 1200 shown in FIG. 12) in order to diagnosis and identify a defect in a library cell or interconnect according to any embodiment of the disclosed technology. At 1302, for example, the client computer sends one or more entries of the failure log (or the failure log itself) to the remote server or computing environment. At 1304, the failure log information is received and loaded by the remote server or by respective components of the remote computing environment. At 1306, fault diagnosis is performed to identify and store one or more defects in a library cell according to any of the disclosed embodiments. At 1308, the remote server or computing environment sends the identified faulty library cells to the client computer, which receives the data at 1310.

It should be apparent to those skilled in the art that the example shown in FIG. 13 is not the only way to detect faults in a library cell using embodiments of the disclosed technology with multiple computers. For instance, the failure log information may be stored on a computer-readable medium that is not on a network and that is sent separately to the server or computing environment (for example, a CD-ROM, DVD, or portable hard drive). Or, the server computer or remote computing environment may perform only a portion of the fault diagnosis procedure. The computing environments of FIGS. 11 and 12 can similarly be used to detect library cell or interconnect defects.

Figure 9:
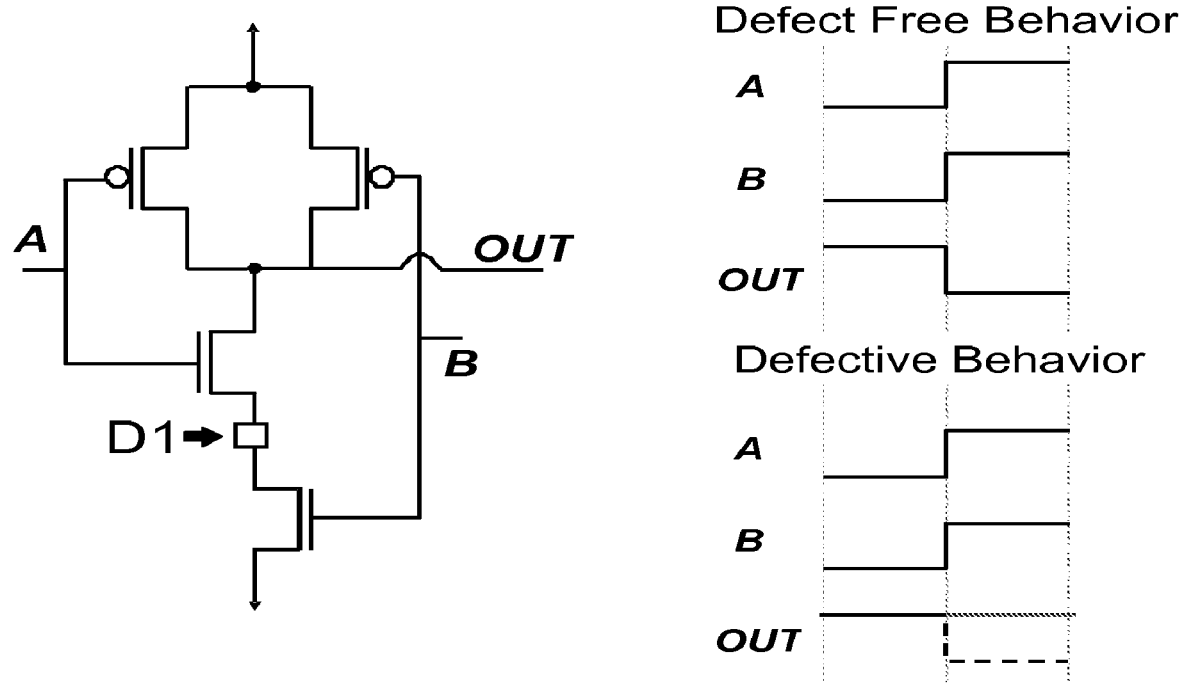
FIG. 9 illustrates a circuit that needs to be tested with a sequence of inputs.

In some instances it is necessary to test a cell with a sequence of test patterns For example, certain cell internal defects like transistor stuck-opens may require a sequence of exercising conditions at the cell inputs to excite them. FIG. 9 illustrates a NAND cell with an open defect. The output of the NAND gate charges a capacitor (not shown). Because the initial charge state of the capacitor is unknown, a sequence of two exercising conditions is required to excite this defect. The first exercising condition (00 in FIG. 9) is required to charge the output capacitance to a logic level 1 (note that this can also be achieved by 01 or 10). The second exercising condition 11 turns ON both the NMOS transistors so that output will discharge the load capacitor to a logic level 0 in a defect free cell.

In a cell with a defect, the output capacitor will not discharge through the cell. In this case the failing conditions will be: 00-11, 01-11 and 10-11. The passing conditions will be XX-10, XX-01 and XX-00. The behavior of the defective cell under the remaining condition, 11-11, will depend on whether the output capacitance was charged before the capture phase.

Embodiments of the active excitation condition extraction techniques introduced above can be extended to handle such situations. For example, the change can include extending the definition of an exercising condition to include a sequence of two binary input value combinations instead of one. The techniques (e.g., the technique described above with respect to FIGS. 10A-10B) will then automatically cover sequence dependent defects. For the case shown in FIG. 7, the failing pattern ECCs will be:

$$ECC_1^f = \{101\text{-}010, 010\text{-}101\} \rightarrow ft_1$$

$$ECC_2^f = \{000\text{-}000\} \rightarrow ft_2$$

$$ECC_3^f = \{101\text{-}000, 000\text{-}000\} \rightarrow ft_3$$

$$ECC_4^f = \{101\text{-}101, 101\text{-}010\} \rightarrow ft_4$$

Note that for the second failing pattern there is no transition. Hence, for this pattern the last shift value is considered since the transition must have come from there. Similarly, the observable passing pattern ECCs will contain a sequence of input value combinations. Once the ECCs have been determined the same algorithms can be used to determine true failing and passing excitation conditions.

Now, the nature of the defect, (i.e. whether it is sequence dependent or not) will not be known beforehand. In one embodiment of the diagnosis technique set forth above, a sequence dependency of two is assumed. The reason for this is that even if the real defect is not sequence dependent, it will still be identified when extracting a sequence of two conditions. This is because the passing and failing excitation conditions will still be disjoint by virtue of the second exercising condition in the sequence. When a cell internal defect is identified assuming a sequence dependency of two, an additional analysis step, this time assuming no sequence dependency, can be performed to determine whether the identified defect is sequence dependent or not.

In order to test the effectiveness of the active excitation condition extraction algorithm described above, controlled experiments were conducted in which the behavior of a failing chip with a cell internal defect during test was emulated. This was done by injecting cell internal defects in a predetermined list of library cell instances. In order to emulate cell internal defect behavior, the target cell instance was replaced with a modified cell in the netlist. This modified cell represented a defective version of the original cell, by having a randomly changed truth table in order to emulate defective behavior. The above modified netlist was then simulated against a stuck-at test pattern set to produce a cell internal defect fail log. Active excitation condition extraction based cell internal diagnosis was then run on the fail logs thus produced, and the effectiveness of the technique in isolating the cell instance with the injected failure was studied. The experiment was performed on a 2.1M gate design. A stuck-at fault test set with a 1000 patterns was used. The test patterns had up-to two capture clock cycles, as well as a mix of leading trailing edge flops and clock driven logic. Hence, each test pattern had either three or six exercising conditions depending on the number of times the capture clock was pulsed in the pattern.

A total of 383 cell internal defect fail logs were generated using the above method and were diagnosed using an embodiment of the active excitation condition extraction techniques (in particular, the embodiment illustrated in FIGS. 10A-10B). In order to validate the diagnosis strategy the percentage of fail logs for which the defective cell was correctly identified was recorded. Furthermore, active excitation condition extraction was validated by matching the failing and passing excitation conditions determined by the algorithm for the defective cell, with those that were used to inject the cell internal defect to begin with. To prove the value of active excitation condition extraction as a key enabler of excitation condition based diagnosis of defective cells (as well as highlight the problem posed by multiple exercising conditions test patterns) the fail logs were also diagnosed based on the passive excitation condition extraction strategy. Recall that this means that it was assumed that all the exercising conditions in the failing patterns are failing excitation conditions and all those in the observable passing patterns are passing excitation conditions.

Results of these experiments are summarized in Table 1. These results clearly prove the effectiveness of the disclosed technology. As reported in the first row, using passive excitation condition extraction, the excitation condition based cell internal diagnosis technique was able to diagnose the correct defective cell instance in only 25% of the cases. In the remaining 75% cases the diagnosis algorithm was not able to establish whether the defect lies inside the cell or on the interconnecting wire. However, with active excitation condition extraction, the percentage of correctly diagnosed cases goes up to 94%. This means that for 94% of the cases the correct defective cell was identified and the failing, passing excitation conditions extracted by the disclosed technology exactly matched (last row in Table 1) with those that were used for defect injection.

TABLE 1

Results of Cell Defect Injection Experiments

| | |
|---|---|
| % Correctly Diagnosed with Passive Excitation | 25% |

TABLE 1-continued

Results of Cell Defect Injection Experiments

| Condition Extraction | |
|---|---|
| % Correctly Diagnosed without Active Excitation Condition Extraction | 94% |
| Correct failing and passing excitation conditions extracted by active excitation extraction? | Yes, for all the diagnosed cases |

For the remaining 6% of the cases for which diagnosis was unsuccessful, the main reason appears to be that, for these cases, a majority of failing and observable passing patterns had identical sets of exercising conditions. In such a case, active excitation condition extraction is not able to distinguish between failing and passing conditions. However, test patterns are highly optimized which means that each pattern attempts to exercise defects in different ways. This results in the rate of occurrence of this special situation to be very small, as is apparent from the experimental results. These results highlight both the severity of the limitation imposed by multiple exercising conditions in test patterns on excitation condition based diagnosis, and the effectiveness of active excitation condition extraction in solving this problem.

Having validated the above disclosed technique using controlled experiments, active excitation condition extraction based diagnosis was applied on a set of failing die of an AMD graphics chip fabricated at TSMC using the 90 nm technology. This was a ~33M gate design with on chip EDT compression logic with a compression ratio of 77x. The analysis was done for two different revisions of the same design. The test sets used had 500 and 1000 compressed test patterns, respectively, for the two revisions. Out of the failing dies that were diagnosed, 7 different die were selected for detailed physical failure analysis (PFA). These 7 die all had a cell internal defect as one of the top candidates reported by diagnosis. PFA results showed that in 7 out of the 7 cases the failing die indeed had a defect inside the cell instance that was reported as a top candidate in the diagnosis report. Out of these 7 cases, 4 could not be correctly diagnosed with passive excitation condition extraction. This provides further validation of the disclosed cell diagnosis approach in a real industrial application. In all of these cases the PFA process was faster and less costly because diagnosis of defective cells eliminated the need for examining any layers above metal layer 1. The following are details on two out of these seven successfully diagnosed cases.

Case-I: In the first case the defect was found to be inside a two input inverting multiplexer cell.

Figure 15:
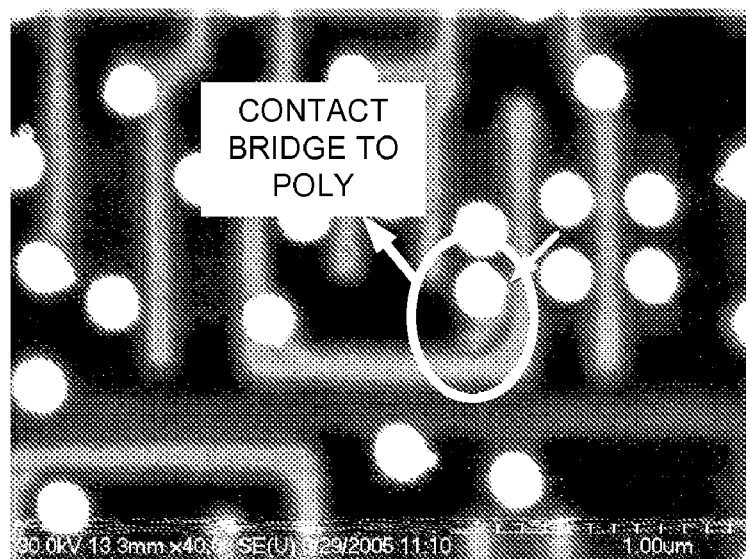
FIG. 15 is a PFA image of the defect of FIG. 14.
Figure 14:
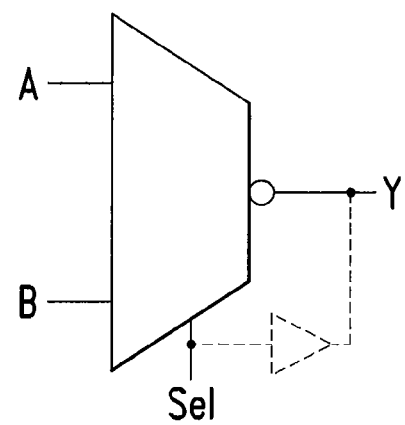
FIG. 14 illustrates a defect site and gate model of a test case.
Figure 14:
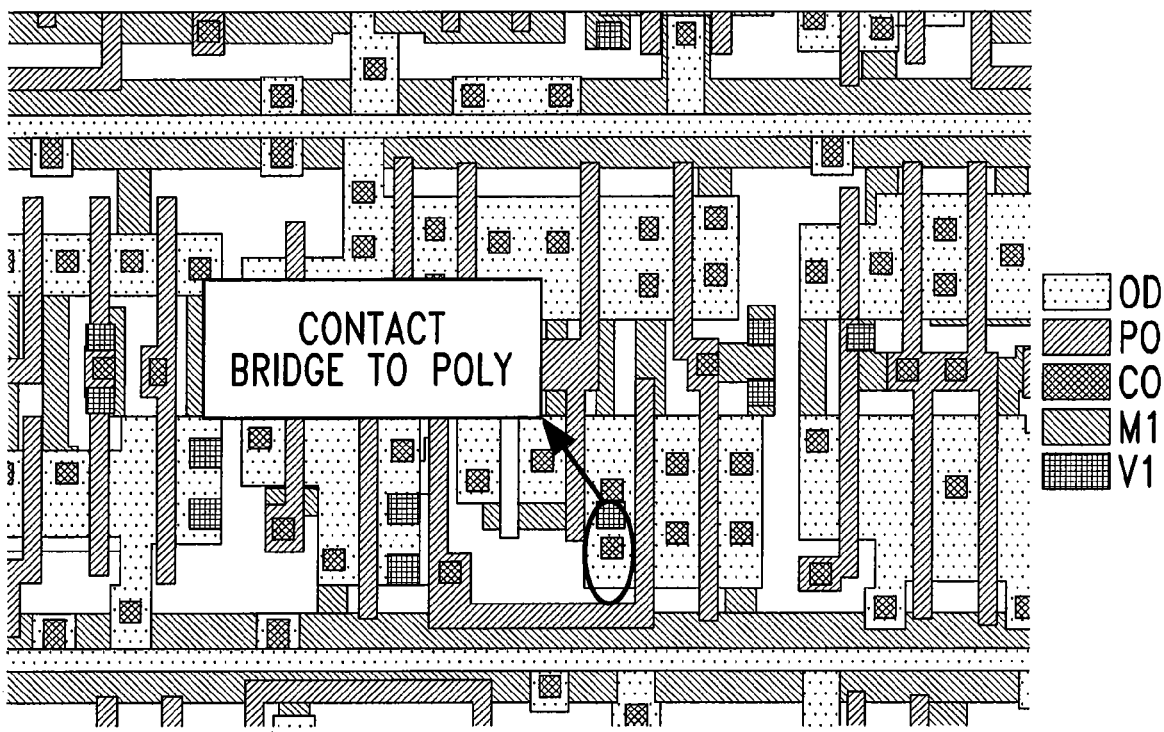

The defective cell had a contact bridge to poly between the output and the select lines of the MUX, as shown in FIG. 14. At a logic level this bridge caused the defective cell to behave as if there was a buffer from the select input to the output of the MUX as shown in FIG. 14. FIG. 14 also shows the failing and passing excitation conditions extracted for this cell using the exemplary embodiment of the active excitation condition extraction technique. One can easily verify these to be correct. FIG. 15 shows a PFA picture of the defect showing the bridge from contact to poly.

Figure 16:
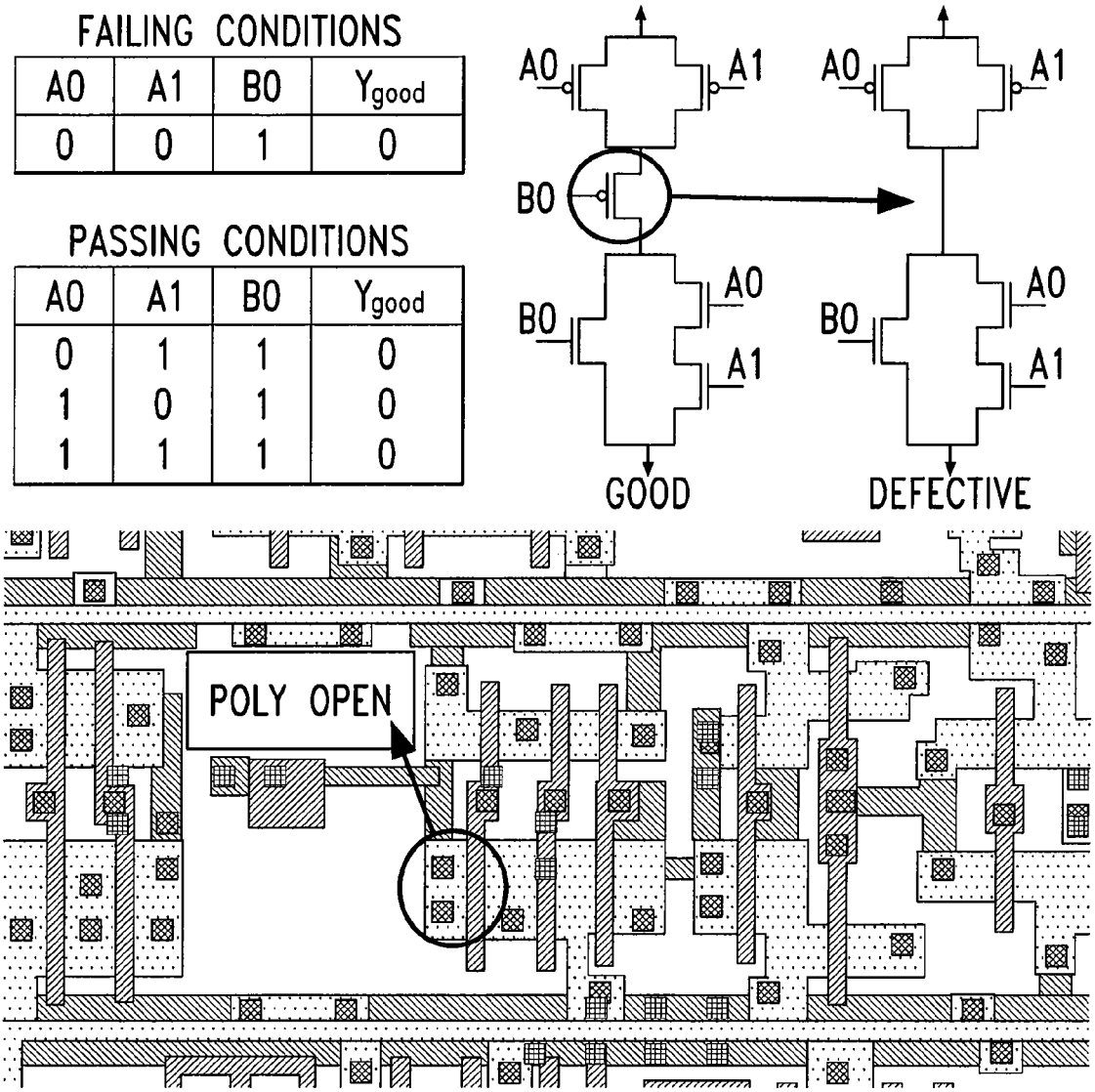
FIG. 16 is a defect site and transistor model of a second test case.

Case-II: In the second case, the defective cell was an AND-OR-Invert cell whose transistor level schematic is shown in FIG. 16.

In this case, the defect was a poly open which resulted in a missing connection from input B0 to the corresponding PMOS (FIG. 16), with the result that the PMOS was always ON. The failing and passing conditions extracted by the exemplary embodiment of FIGS. 10A-10B are also shown in FIG. 16. In this case, it can be easily verified that the extracted failing condition A0 A1 B0=001 is indeed correct, since this leads to a path from power to ground in the defective cell due to the B0 PMOS being always ON. However, when the extracted passing conditions were analyzed, two of the conditions 011 and 101, apparently should also have been failing conditions from a purely switch level simulation point of view. A little more detailed look at the circuit easily explains this anomaly. For the input condition 001 both the PMOS transistors corresponding to A0 and A1 are ON. This creates a stronger pull to $V_{dd}$ and hence results in the output of the cell being a faulty 1. The input conditions 011 and 101 both result in only one of the PMOS transistors (corresponding to A0 or A1) being ON. Hence this may result in the output voltage to correspond to a logic value of 0, the correct value.

The disclosed technology describes embodiments of a diagnosis technique that differentiates between cell-internal and interconnect defects to speed-up defect root cause analysis for industrial designs. The existence of multiple exercising conditions in test patterns has been identified as a major roadblock to cell internal diagnosis for industrial designs. The disclosed technology describes embodiments of practical, active excitation condition extraction techniques that can correctly determine passing and failing excitation conditions from such patterns. The techniques also work for designs with compressed patterns. Furthermore, the disclosed technology can also handle defects requiring a sequence of values for excitation. Experimental results, both in a controlled simulated environment and on real industrial failing devices, prove the effectiveness and accuracy of an embodiment of the disclosed technology and hence its ability to speed up the PFA process and the overall yield loss factor analysis.

The application of the active excitation condition extraction techniques described herein are not limited to cell internal defects, but can also be directly applied to other kind of defects like interconnect opens and bridges where the defect excitation may depend on the neighboring net values.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims and their equivalents. We therefore claim as our invention all that comes within the scope of these claims and equivalents thereof.

We claim:

1. A method of detecting defects in a selected cell of an integrated circuit, comprising:
    determining one or more failing test patterns that produce an indication of one or more defects during testing of the integrated circuit;
    determining a set of one or more exercising conditions applied to the selected cell during a capture phase of the testing of the integrated circuit for each of the one or more failing test patterns;
    determining one or more observable passing test patterns that are capable of exciting a defect in the selected cell but that did not produce an indication of one or more defects during the testing;
    determining a set of one or more exercising conditions applied to the selected cell during the capture phase of the testing of the integrated circuit for each of the one or more observable passing test patterns;
    classifying the exercising conditions for the failing test patterns and the observable passing test pattern; and analyzing the classified exercising conditions for the failing test patterns and the observable passing test patterns to determine if there is a defect in the selected cell.

2. The method of claim 1, wherein the exercising conditions are classified as failing excitation conditions or passing excitation conditions and wherein the classified exercising conditions are analyzed by determining a percentage of failing excitation conditions for the failing test patterns that are not present in the classified exercising conditions for the observable passing test patterns.

3. The method of claim 2, further comprising: comparing the percentage to a threshold and determining that the defect is in the selected cell based on the comparison.

4. The method of claim 1, further wherein the classified exercising conditions for the failing test patterns and the observable passing test patterns are analyzed for logical inconsistencies.

5. The method of claim 4, further comprising determining that there is a defect in interconnect wiring at the integrated circuit.

6. The method of claim 5, wherein the analysis for logical inconsistencies includes:
determining if there are no exercising conditions classified as a failing excitation condition for a failing test pattern and if so, determining that there is a defect in interconnect wiring of the integrated circuit.

7. The method of claim 1, wherein the exercising conditions are classified by:
grouping the exercising conditions for the failing test patterns into one or more sets;
grouping the exercising conditions for the observable passing test patterns into one or more sets; and
determining if an exercising condition is included in a set of failing test pattern exercising conditions and is not present in a set of observable passing test pattern exercising conditions and if so, defining the exercising condition as a failing excitation condition.

8. The method of claim 7, further comprising:
determining if an exercising condition is included in a set of observable passing test pattern exercising conditions and is not present in a set of failing test pattern exercising conditions and, if so, defining the exercising condition as a passing excitation condition.

9. The method of claim 8, wherein the exercising conditions are further classified by:
defining one or more of the exercising conditions that are not classified as failing excitation conditions or passing excitation conditions as undecided exercising conditions.

10. The method of claim 9, wherein the exercising conditions are further classified by:
analyzing each set of exercising conditions for the failing test patterns to determine if the set of exercising conditions for the failing test pattern includes a single undecided exercising condition and no failing excitation conditions, and if so, defining the undecided exercising condition as a failing excitation condition.

11. The method of claim 10, wherein the exercising conditions are further classified by:
analyzing each set of exercising conditions for the observable passing test patterns to determine if the set of exercising conditions for the observable passing test pattern includes a single undecided exercising condition and no passing excitation conditions, and if so, defining the undecided exercising condition as a passing excitation condition.

12. The method of claim 11, wherein the exercising conditions are further classified by:
selecting an exercising condition that occurs in the largest number of sets for the observable passing test patterns and defining the selected exercising condition as a passing excitation condition.

13. The method of claim 12, wherein the exercising conditions are further classified by:
re-analyzing each remaining undecided exercising condition to classify it as a failing excitation condition or a passing excitation condition.

14. The method of claim 1, further comprising storing an indication of the defect in one or more computer-readable media.

15. The method of claim 1, wherein the observable passing test patterns and the failing test patterns include test patterns that are applied in sequence and that target timing defects in the selected cell of the integrated circuit.

16. An integrated circuit including a cell having a defect that is diagnosed by any one of method claims 1-13.

17. An electronic device comprising the integrated circuit of claim 16.

18. A computer readable media storing an indication that a detected defect is in a cell of an integrated circuit or in an interconnect coupled to the selected cell, the indication being determined at least in part using any one of method claims 1-14.

19. A computer system including a programmable processor that executes instructions in order to diagnose a defect in an integrated circuit in accordance with any one of method claims 1-14.

20. A method, comprising:
determining exercising conditions of observable passing test patterns and failing test patterns applied during a capture phase of testing of an integrated circuit, the observable passing test patterns and failing test patterns being test patterns that target defects in a selected cell of the integrated circuit and that create one or more exercising conditions in the selected cell during application of each respective test pattern;
analyzing the exercising conditions for the failing test patterns and the observable passing test patterns to determine if a defect is in the selected cell by categorizing one or more of the exercising conditions into one of multiple categories, at least one of the categories indicating that a corresponding exercising condition excites a defect in the selected cell; and
storing the defect identification in a computer-readable media.

21. The method of claim 20, wherein another at least one of the categories indicates that the corresponding exercising condition does not excite any defect in the selected cell.

22. The method of claim 20, wherein the act of determining if the defect is in the selected cell comprises identifying the defect as being in the selected cell if at least one exercising condition from each of the failing patterns is categorized in the category indicating that the corresponding exercising condition excites the defect in the selected cell.

23. The method of claim 20, wherein the observable passing test patterns and failing test patterns include test patterns that are applied in sequence and that target timing defects in the selected cell of the integrated circuit.

24. The method of claim 20, wherein the act of determining if the defect is in the selected cell comprises identifying the defect as being in the selected cell if all exercising conditions from each of the observable passing test patterns are categorized in the category that indicates the corresponding exercising condition does not excite any defect in the selected cell.

25. One or more computer-readable media storing instructions that are executable by a computer and cause the computer to perform a method of detecting defects in a selected cell of an integrated circuit, the method comprising:
   determining one or more failing test patterns that produce an indication of one or more defects during testing of the integrated circuit;
   determining a set of one or more exercising conditions applied to the selected cell during a capture phase of the testing of the integrated circuit for each of the one or more failing test patterns;
   determining one or more observable passing test patterns that are capable of exciting a defect in the selected cell but that did not produce an indication of one or more defects during the testing;
   determining a set of one or more exercising conditions applied to the selected cell during the capture phase of the testing of the integrated circuit for each of the one or more observable passing test patterns;
   classifying the exercising conditions for the failing test patterns and the observable passing test pattern; and
   analyzing the classified exercising conditions for the failing test patterns and the observable passing test patterns to determine if there is a defect in the selected cell.

26. The computer-readable media of claim 25, wherein the exercising conditions are classified as failing excitation conditions or passing excitation conditions and wherein the classified exercising conditions are analyzed by determining a percentage of failing excitation conditions for the failing test patterns that are not present in the classified exercising conditions for the observable passing test patterns.

27. The computer-readable media of claim 26, wherein the method further comprises: comparing the percentage to a threshold and determining that the defect is in the selected cell based on the comparison.

28. The computer-readable media of claim 25, wherein the classified exercising conditions for the failing test patterns and the observable passing test patterns are analyzed for logical inconsistencies.

29. The computer-readable media of claim 28, wherein the method further comprises determining that there is a defect in interconnect wiring at the integrated circuit.

30. The computer-readable media of claim 29, wherein the analysis for logical inconsistencies includes:
   determining if there are no exercising conditions classified as a failing excitation condition for a failing test pattern and if so, determining that there is a defect in interconnect wiring of the integrated circuit.

31. The computer-readable media of claim 25, wherein the exercising conditions are classified by:
   grouping the exercising conditions for the failing test patterns into one or more sets;
   grouping the exercising conditions for the observable passing test patterns into one or more sets; and
   determining if an exercising condition is included in a set of failing test pattern exercising conditions and is not present in a set of observable passing test pattern exercising conditions and if so, defining the exercising condition as a failing excitation condition.

32. The computer-readable media of claim 31, wherein the method further comprises:
   determining if an exercising condition is included in a set of observable passing test pattern exercising conditions and is not present in a set of failing test pattern exercising conditions and, if so, defining the exercising condition as a passing excitation condition.

33. The computer-readable media of claim 32, wherein the exercising conditions are further classified by:
   defining one or more of the exercising conditions that are not classified as failing excitation conditions or passing excitation conditions as undecided exercising conditions.

34. The computer-readable media of claim 33, wherein the exercising conditions are further classified by:
   analyzing each set of exercising conditions for the failing test patterns to determine if the set of exercising conditions for the failing test pattern includes a single undecided exercising condition and no failing excitation conditions, and if so, defining the undecided exercising condition as a failing excitation condition.

35. The computer-readable media of claim 34, wherein the exercising conditions are further classified by:
   analyzing each set of exercising conditions for the observable passing test patterns to determine if the set of exercising conditions for the observable passing test pattern includes a single undecided exercising condition and no passing excitation conditions, and if so, defining the undecided exercising condition as a passing excitation condition.

36. The computer-readable media of claim 35, wherein the exercising conditions are further classified by:
   selecting an exercising condition that occurs in the largest number of sets for the observable passing test patterns and defining the selected exercising condition as a passing excitation condition.

37. The computer-readable media of claim 36, wherein the exercising conditions are further classified by: re-analyzing each remaining undecided exercising condition to classify it as a failing excitation condition or a passing excitation condition.

38. One or more computer-readable media storing computer-executable instructions for causing a computer to perform a method, the method comprising:
   determining exercising conditions of observable passing test patterns and failing test patterns applied during a capture phase of testing of an integrated circuit, the observable passing test patterns and failing test patterns being test patterns that target defects in a selected cell of the integrated circuit and that create one or more exercising conditions in the selected cell during application of each respective test pattern; and
   analyzing the exercising conditions for the failing test patterns and the observable passing test patterns to determine if a defect is in the selected cell by categorizing one or more of the exercising conditions into one of multiple categories, at least one of the categories indicating that a corresponding exercising condition excites a defect in the selected cell.

39. The computer-readable media of claim 38, wherein another at least one of the categories indicates that the corresponding exercising condition does not excite any defect in the selected cell.

40. The computer-readable media of claim 38, wherein the act of determining if the defect is in the selected cell comprises identifying the defect as being in the selected cell if at least one exercising condition from each of the failing patterns is categorized in the category indicating that the corresponding exercising condition excites the defect in the selected cell.

41. The computer-readable media of claim 38, wherein the observable passing test patterns and the failing test patterns include test patterns that are applied in sequence and that target timing defects in the selected cell of the integrated circuit.

42. The computer-readable media of claim 38, wherein the act of determining if the defect is in the selected cell comprises identifying the defect as being in the selected cell if all exercising conditions from each of the observable passing test patterns are categorized in the category that indicates the corresponding exercising condition does not excite any defect in the selected cell.

* * * * *